United States Patent
Kawashita et al.

(10) Patent No.: US 9,240,666 B2
(45) Date of Patent: Jan. 19, 2016

(54) OPTICAL AMPLIFICATION DEVICE AND METHOD OF CONTROLLING OPTICAL MODULE

(71) Applicants: FUJITSU LIMITED, Kawasaki-shi, Kanagawa (JP); FUJITSU TELECOM NETWORKS LIMITED, Kawasaki-shi, Kanagawa (JP)

(72) Inventors: Mitsuya Kawashita, Kawanishi (JP); Jinlin Zhang, Neyagawa (JP); Eiji Maeda, Kadoma (JP); Shota Mori, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/257,298

(22) Filed: Apr. 21, 2014

(65) Prior Publication Data

US 2014/0340739 A1    Nov. 20, 2014

(30) Foreign Application Priority Data

May 16, 2013    (JP) .................................. 2013-104558

(51) Int. Cl.

| | |
|---|---|
| *H01S 3/00* | (2006.01) |
| *H01S 3/067* | (2006.01) |
| *H01S 5/068* | (2006.01) |
| *H01S 5/50* | (2006.01) |
| *H04B 10/291* | (2013.01) |
| *H01S 5/04* | (2006.01) |
| *H01S 5/06* | (2006.01) |
| *H01S 5/062* | (2006.01) |

(52) U.S. Cl.
CPC ......... *H01S 3/06754* (2013.01); *H01S 5/06825* (2013.01); *H01S 5/5027* (2013.01); *H04B 10/291* (2013.01); *H01S 5/041* (2013.01); *H01S 5/0617* (2013.01); *H01S 5/06216* (2013.01); *H04B 2210/08* (2013.01)

(58) Field of Classification Search
CPC ............ H04B 2210/08; H01S 3/06754; H01S 5/06825; H01S 5/5027; H01S 5/06216; H01S 5/0617
USPC ........................................................ 359/337
See application file for complete search history.

(56) References Cited

U.S. PATENT DOCUMENTS

| | | | |
|---|---|---|---|
| 6,583,899 B1 * | 6/2003 | Casanova et al. .................. 398/9 |
| 7,519,300 B2 * | 4/2009 | Ohtani et al. .................. 398/177 |
| 2005/0185957 A1 | 8/2005 | Ohtani et al. | |

FOREIGN PATENT DOCUMENTS

| | | |
|---|---|---|
| JP | 2005-244305 | 9/2005 |
| JP | 2010-279956 | 12/2010 |

* cited by examiner

*Primary Examiner* — Mark Hellner
(74) *Attorney, Agent, or Firm* — Staas & Halsey LLP

(57) ABSTRACT

An optical amplification device includes: an optical module that outputs an amplified light; and a controller that makes the optical module emit a light when an emission command is input into the controller, wherein the controller cancels an inputting of the emission command until a predetermined time passes, when a protection for forbidding a light emission of the optical module is canceled.

10 Claims, 8 Drawing Sheets

FIG. 1A
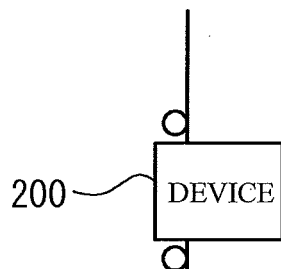
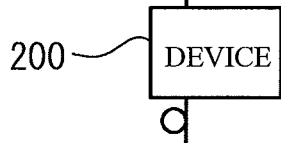
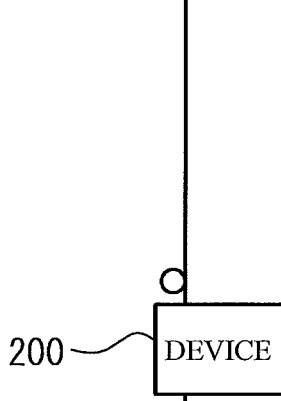
FIG. 1B
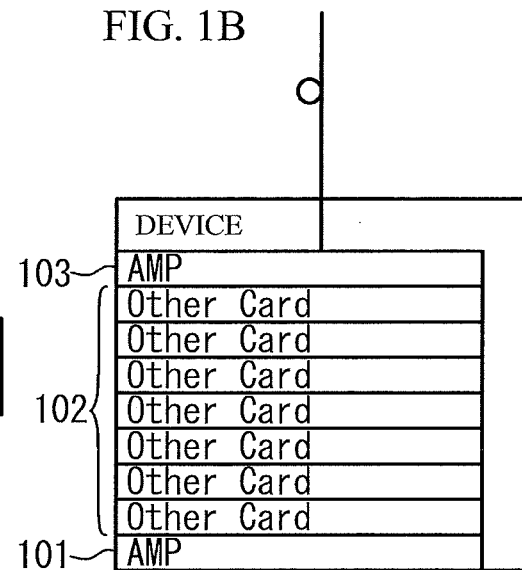

FIG. 5A
BEFORE IMPROVEMENT
  Other Register "WRITE"
  Other Register "WRITE"
  PROTECTION CANCEL
  EMISSION COMMAND ← EMISSION
  Other Register "WRITE"
  Other Register "WRITE"
  Other Register "WRITE"

FIG. 5B
EMBODIMENT
  Other Register "WRITE"
  Other Register "WRITE"
  PROTECTION CANCEL
  EMISSION COMMAND ← NOT EMITTING
  Other Register "WRITE"
  Other Register "WRITE"
  Other Register "WRITE"

FIG. 5C
BEFORE IMPROVEMENT
  ESTIMATION 1
    Other Register "WRITE"
    Other Register "WRITE"
    PROTECTION CANCEL
    Other Register "WRITE"
    Other Register "WRITE"
      . . .
  END OF ESTIMATION 1

ESTIMATION 2
    Other Register "WRITE"
    Other Register "WRITE"
    EMISSION COMMAND ← EMISSION
    Other Register "WRITE"
    Other Register "WRITE"
      . . .
  END OF ESTIMATION 2

FIG. 5D
EMBODIMENT
  ESTIMATION 1
    Other Register "WRITE"
    Other Register "WRITE"
    PROTECTION CANCEL
    Other Register "WRITE"
    Other Register "WRITE"
      . . .
  END OF ESTIMATION 1

ESTIMATION 2
    Other Register "WRITE"
    Other Register "WRITE"
    EMISSION COMMAND ← NOT EMITTING
    Other Register "WRITE"
    Other Register "WRITE"
      . . .
  END OF ESTIMATION 2

OPTICAL AMPLIFICATION DEVICE AND METHOD OF CONTROLLING OPTICAL MODULE

CROSS-REFERENCE TO RELATED APPLICATION

This application is based upon and claims the benefit of priority of the prior Japanese Patent Application No. 2013-104558, filed on May 16, 2013, the entire contents of which are incorporated herein by reference.

FIELD

A certain aspect of embodiments described herein relates to an optical amplification device and a method of controlling an optical module.

BACKGROUND

In an optical communication between stations, an optical module for optical amplification amplifies an optical signal in order to amplify a maximum output of the optical signal, For example, Japanese Patent Application Publications No. 2005-244305 (hereinafter referred to as Document 1) and No. 2010-279956 (hereinafter referred to as Document 2) disclose a countermeasure against an erroneous light emission.

However, Document 1 and Document 2 lack in safety measure during canceling an light emission.

SUMMARY

According to an aspect of the present invention, there is provided an optical amplification device including: an optical module that outputs an amplified light; and a controller that makes the optical module emit a light when an emission command is input into the controller, wherein the controller cancels an inputting of the emission command until a predetermined time passes, when a protection for forbidding a light emission of the optical module is canceled.

According to another aspect of the present invention, there is provided a method of controlling an optical module comprising canceling inputting of an emission command until a predetermined time passes, when a protection for forbidding a light emission of an optical module that outputs an amplified light when a light emission command is input is canceled.

BRIEF DESCRIPTION OF DRAWINGS

FIG. 1A and FIG. 1B illustrate a schematic view of an optical transmission system to which an optical amplification device in accordance with an embodiment is applied;

FIG. 5A and FIG. 5B illustrate a register-write test;

FIG. 5C and FIG. 5D illustrate a case where a plurality of estimations are sequentially performed.

DESCRIPTION OF EMBODIMENTS

FIG. 1A and FIG. 1B illustrate a schematic view of an optical transmission system to which an optical amplification device in accordance with an embodiment is applied. As illustrated in FIG. 1A, the optical transmission device has a structure in which an optical transmission device 200 provided in each station is coupled with each other via an optical fiber. As illustrated in FIG. 1B, the optical transmission device 200 has an optical amplification device 101, a process device 102, an optical amplification device 103, and so on. The optical amplification device 101 amplifies an optical signal received from the optical transmission device 200 of another station to a power which the process device 102 can process. The process device 102 processes the optical signal amplified by the optical amplification device 101. The optical amplification device 103 amplifies the optical signal processed by the process device 102 to a power allowing a transmission of the optical signal to a next station.

Figure 2:
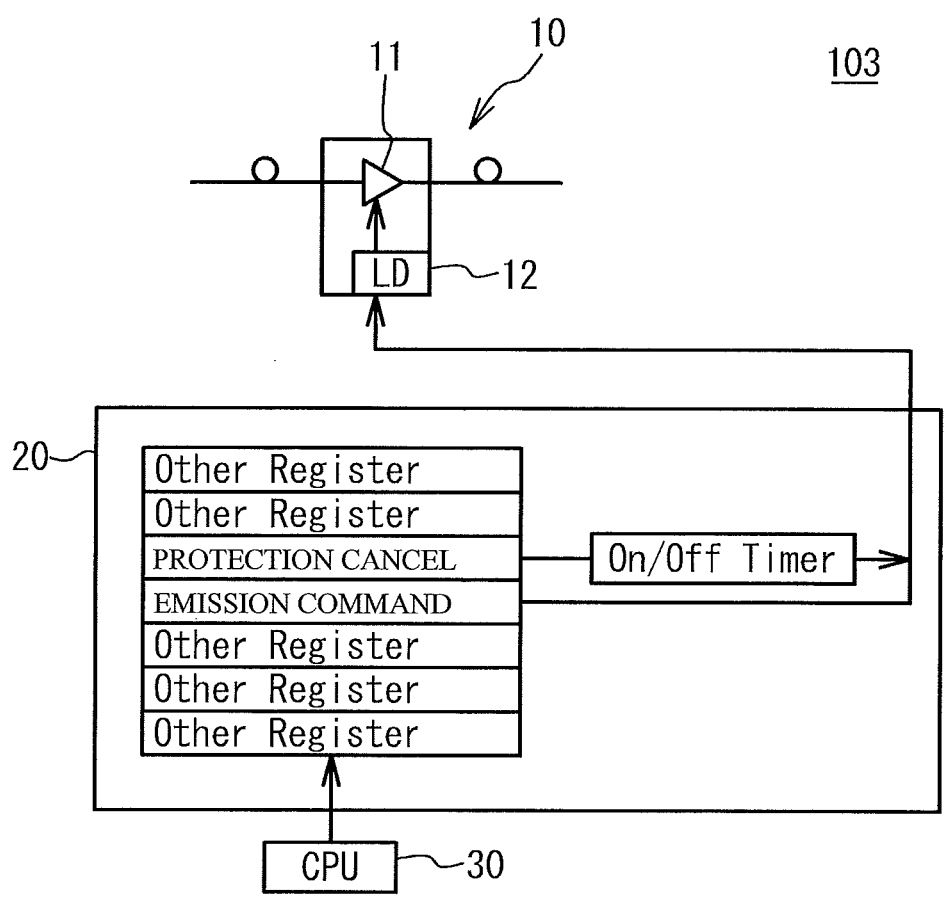
FIG. 2 illustrates a structure of an optical amplification device.

FIG. 2 illustrates a structure of the optical amplification device 103. As illustrated in FIG. 2, the optical amplification device 103 has an optical module 10, a control device 20, a CPU 30 and so on. The optical module 10 is a module for outputting an amplified light, and has an optical amplifier 11, a light source 12 and so on. The optical amplifier 11 amplifies a signal from the process device 102 with use of a light from the light source 12. For example, the optical amplifier 11 is a semiconductor optical amplifier. The light source 12 is, for example, a laser diode. The control device 20 is a control unit for controlling the optical module 10. The control device 20 is, for example, structured with a FPGA (Field Programmable Gate Array) or the like. The CPU 30 is a Central Processing Unit. The CPU 30 performs a control of each device, collects an alarm or the like, and writes a command in a register of the control device 20 in accordance with an instruction from an outer component.

The command written in the control device 20 by the CPU 30 includes a protection cancel command, an emission command and so on. The projection cancel command is a command for cancelling a protection prohibiting an emission of the optical module 10. The emission command is a command for making the light source 12 emit a light. In FIG. 2, the protection cancel command and the emission command are written in a register of the control device 20.

The control device 20 prohibits the emission of the optical module 10 until a predetermined condition of the emission is satisfied, when the control device 20 receives a protection cancel command from the CPU 30. In concrete, the control device 20 activates an output enable for a predetermined time after a predetermined time passes after receiving the protection cancel command from the CPU 30. The activation of the output enable is performed by an On/Off timer unit of the control device 20. The control device 20 inputs an emission command that is input for a time when the output enable is activated into the light source 12, and cancels the emission command that is input for a time when the output enable command is not activated. The light source 12 inputs a light into the optical amplifier 11 when the emission command is input from the control device 20. As mentioned above, in the embodiment, a predetermined condition relating to an emission is that the emission command is input for a time when the output enable is activated. And, the optical module 10 emits a light when the predetermined condition is satisfied.

Figure 3:
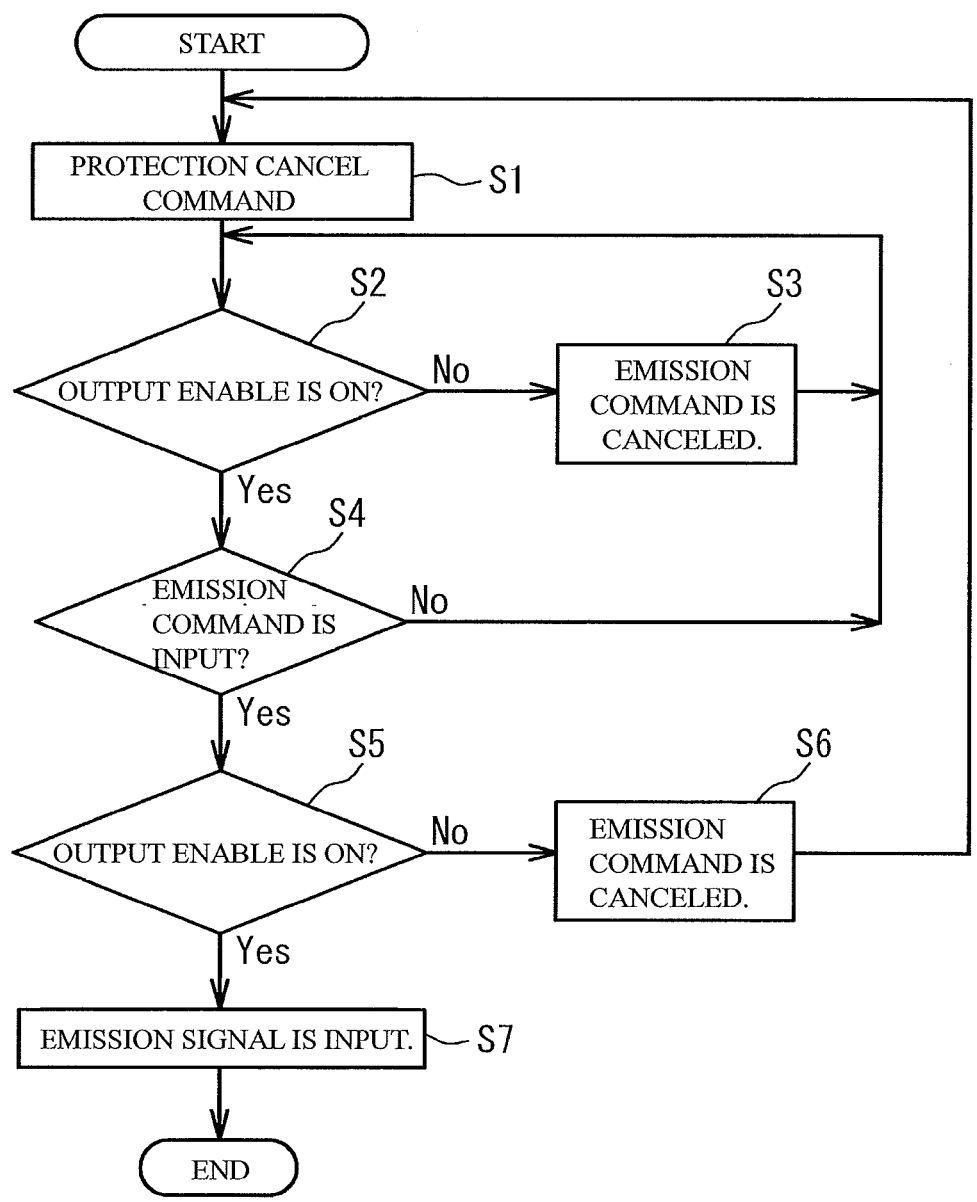
FIG. 3 illustrates a flowchart of an operation example of a control device.

FIG. 3 illustrates a flowchart of an operation example of the control device 20. As illustrated in FIG. 3, the control device 20 holds it until a protection cancel command is input by the CPU 30 (Step S1). When the protection cancel command is input, the control device 20 determines whether an output enable is activated or not
(Step S2). When it is determined as "No" in the Step S2, the control device 20 cancels an emission command input by the CPU 30 (Step S3). After the Step S3, the Step S2 is executed again.

When it is determined as "Yes" in the Step S2, the control device 20 determines whether an emission command is input or not (Step S4). When it is determined as "No" in the Step S4, the Step S2 is executed again. When it is determined as "Yes" in the Step S4, the control device 20 determines whether the output enable is activated or not (Step S5). When it is determined as "No" in the Step S5, the control device 20 cancels the emission command confirmed in the Step S4 (Step S6). After the Step S6, the Step S1 is executed again. When it is determined as "Yes" in the Step S5, the control device 20 inputs an emission signal into the light source 12 (Step S7). Thus, the light source 12 outputs a light to the optical amplifier 11. Accordingly, the optical amplifier 11 amplifies the light and outputs the amplified light.

Figure 4:
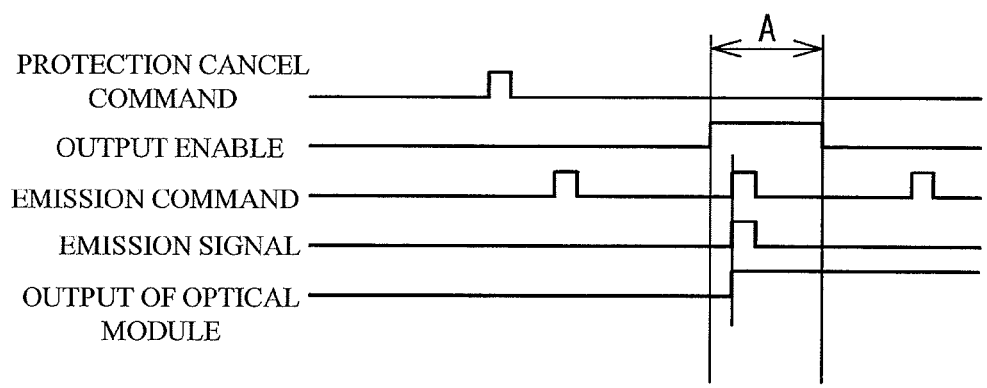
FIG. 4 illustrates a time chart of an operation of a control device.

FIG. 4 illustrates a time chart of an operation of the control device 20. As illustrated in FIG. 4, the control device 20 activates an output enable for a predetermined time after a predetermined time passes after inputting of a protection cancel command. In FIG. 4, the output enable is activated in a period A. An emission command for a period when the output enable is not activated is canceled. The control device 20 inputs an emission signal into the light source 12 when an emission command is input in the period A. When the emission signal is output from the control device 20, the optical module 10 starts outputting of an optical signal. When the optical outputting of the optical module 10 is started, the optical module 10 continues the optical outputting even if a period of the output enable is terminated.

In accordance with the embodiment, the optical module 10 cancels an emission command until a predetermined time passes after the protection is canceled. Thus, the emission is forbidden. Accordingly, a safety measure is taken when the emission is allowed. For example, an erroneous emission is prevented in a continuous access such as a register-write test. When a plurality of estimations are performed continuously, an emission command is canceled even if the emission command is input in a second estimation under a condition that a protection is missed in a first estimation, because an emission enable is limited to a predetermined period after a predetermined time passes. Therefore, an erroneous emission is prevented in a continuous test or the like.

FIG. 5A and FIG. 5B illustrate the register-write test. As illustrated in FIG. 5A, when an emission command is input sequentially after a protection cancel command in the register-write test, an optical module emits a light under ordinary circumstances when an emission command is input. In contrast, in the embodiment, as illustrated in FIG. 5B, the emission command is canceled until a predetermined time passes after a protection is canceled. In this case, the optical module does not emit a light in a continuous access. Therefore, an erroneous emission is prevented.

FIG. 5C and FIG. 5D illustrate a case where a plurality of estimations are sequentially performed. As illustrated in FIG. 5C, in ordinary circumstances, the optical module emits a light when an emission command is input, in a case where the emission command is input in a second estimation under a condition that a protection is missed in a first estimation. In contrast, in the embodiment, as illustrated in FIG. 5D, an emission command is canceled even if the emission command is input in a second estimation under a condition that a protection is missed in a first estimation. That is, a cancelling of the protection is required in every estimation. Therefore, an erroneous light emission is prevented.

Figure 6:
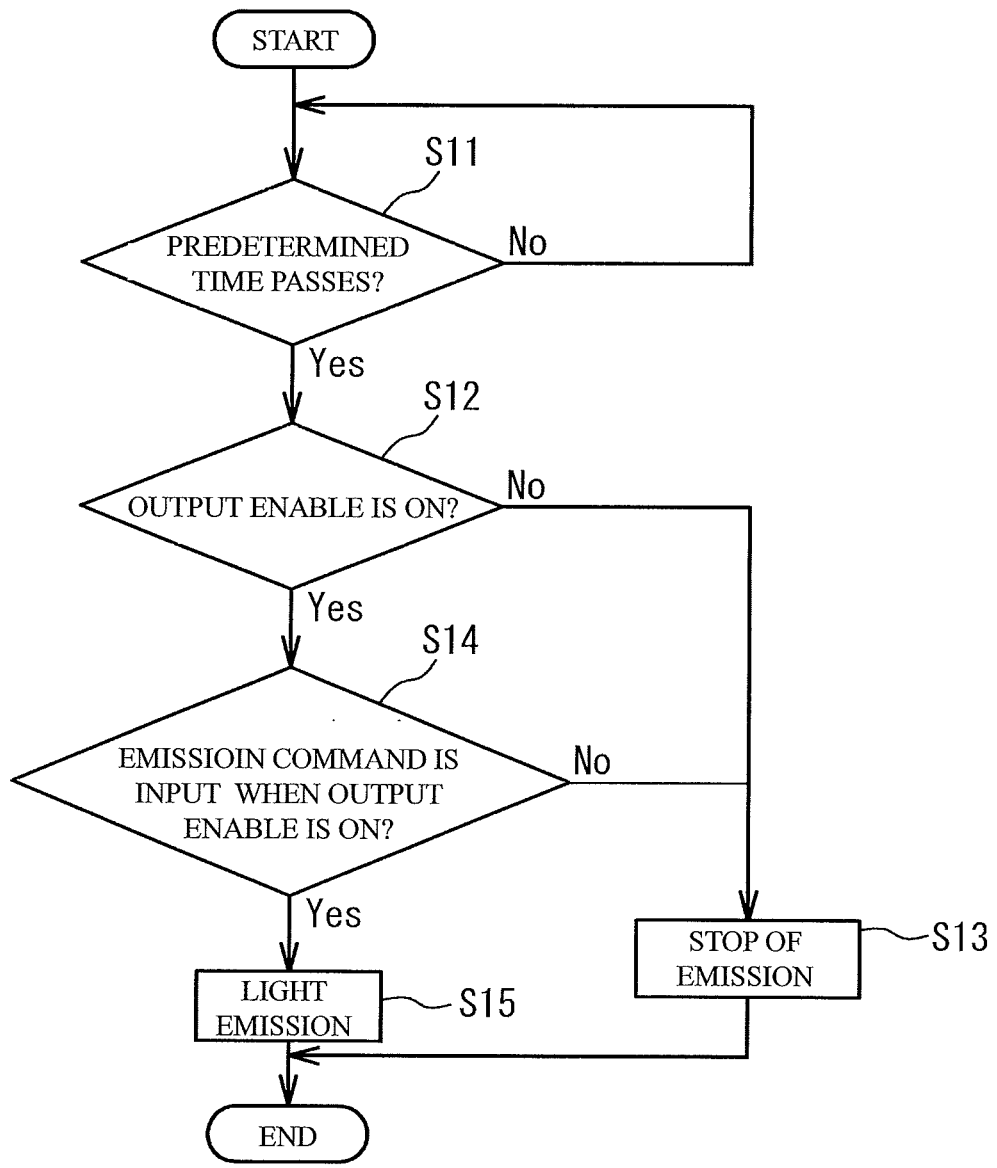
FIG. 6 illustrates a flowchart of another example of an operation of a control device.

FIG. 6 illustrates a flowchart of another example of an operation of the control device 20. The flowchart of FIG. 6 is executed when the optical module 10 starts to emit a light in the flowchart of FIG. 3. In the flowchart of FIG. 6, an output enable is activated again for a predetermined time when a predetermined time (for example, one minute) passes after the last output enable is inactivated. As illustrated in FIG. 6, the control device 20 determines whether the above-mentioned predetermined time passes or not after an emission signal is output (Step S11). When it is determined as "No" in the Step S11, the Step S11 is executed again.

When it is determined as "Yes" in the Step S11, the control device 20 determines whether an output enable is activated or not (Step S12). When it is determined as "No" in the Step S12, the control device 20 stops the light emission of the optical module 10 (Step S13). After that, the execution of the flowchart is terminated. When it is determined as "Yes" in the Step S12, the control device 20 determines whether an emission command is input in a period when the output enable is activated (Step S14).

When it is determined as "No" in the Step S14, the Step S13 is executed. When it is determined as "Yes" in the Step S14, the control device 20 continues the light emission (Step S15). After that, the execution of the flowchart is terminated. After the execution of the Step S15, the flowchart of FIG. 6 is executed again. In this way, an erroneous continuation of the light emission of the optical module 10 is prevented by confirming whether a predetermined condition of the light emission is satisfied at predetermined intervals when the optical output of the optical module 10 is started.

Figure 7:
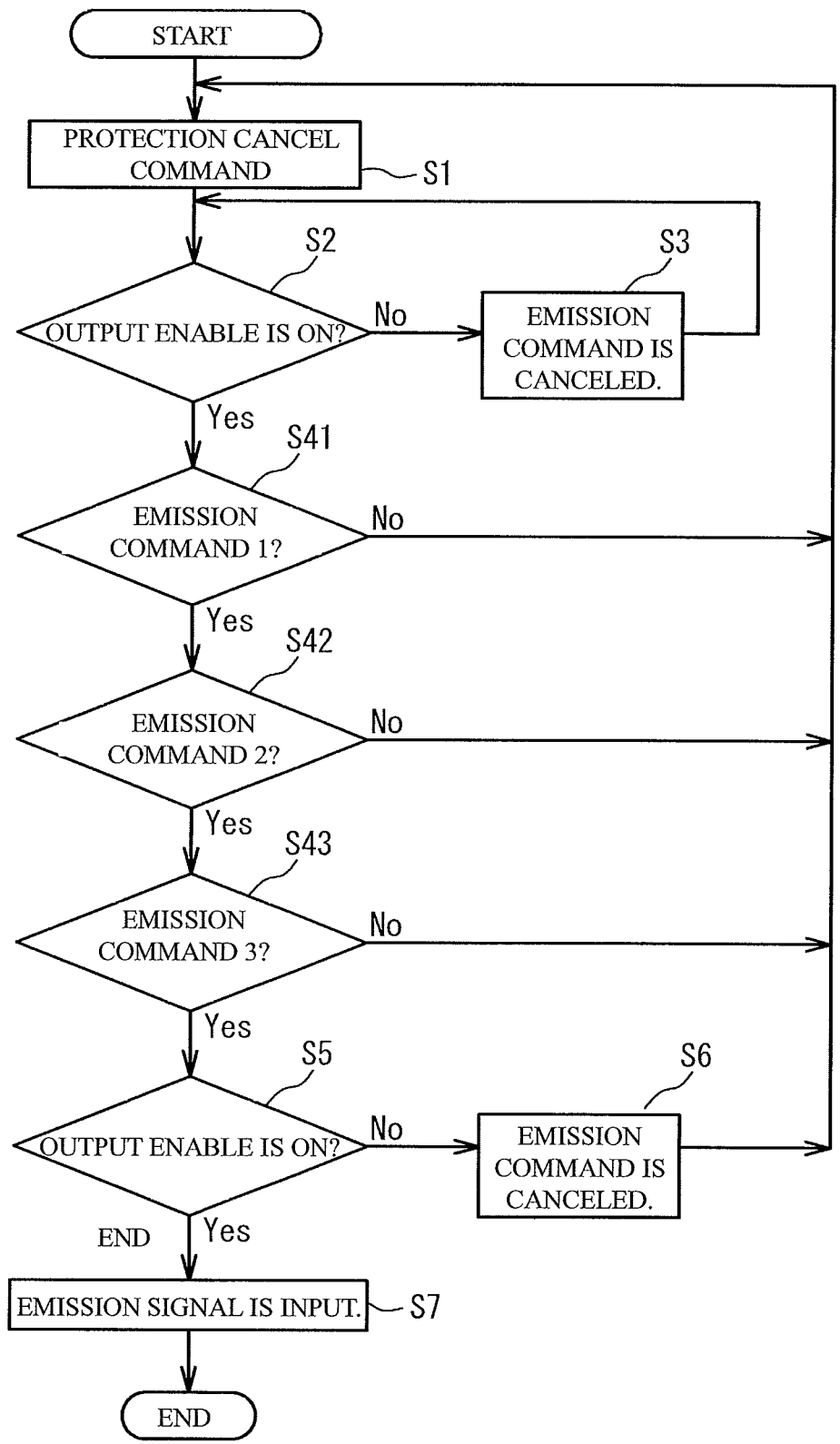
FIG. 7 illustrates a flowchart of another example of an operation of a control device.

FIG. 7 illustrates a flowchart of another example of an operation of the control device 20. A flowchart of FIG. 7 is different from the flowchart of FIG. 3 in a point that Steps S41 to S43 are executed instead of the Step S4. In the following description, the Steps S41 to S43 are described. When it is determined as "Yes" in the Step S2, the control device 20 determines whether an emission command 1 is input or not (Step S41). When it is determined as "No" in the Step S41, the Step S1 is executed again.

When it is determined as "Yes" in the Step S41, the control device 20 determines whether an emission command 2 is input or not (Step S42). When it is determined as "No" in the Step S42, the step S1 is executed again. When it is determined as "Yes" in the Step S42, the control device 20 determines whether an emission command 3 is input or not (Step S43). When it is determined as "No" in the Step S43, the Step S1 is executed again. When it is determined as "Yes" in the Step S43, the control device 20 executes the Step S5. In this way, in the flowchart of FIG. 7, the predetermined condition of the light emission is that a plurality of different emission commands are input in a predetermined order for a period when the output enable is activated.

Figure 8A:
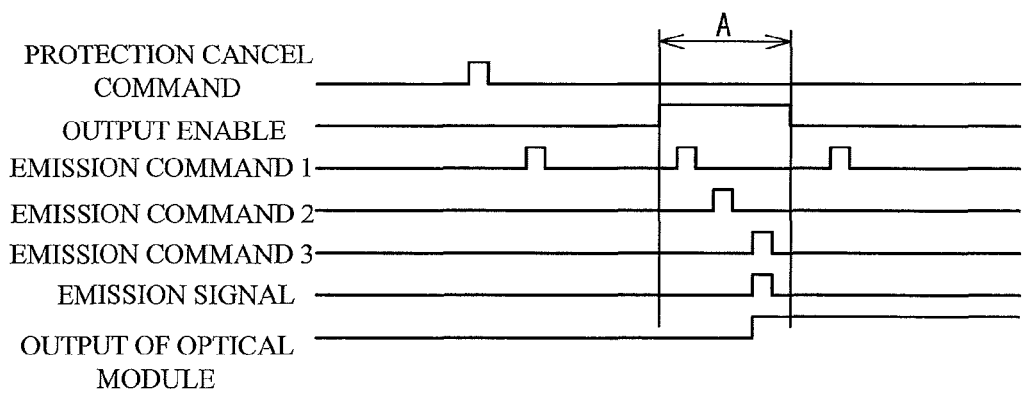
FIG. 8A and FIG. 8B illustrate a time chart of an operation of a flowchart of FIG. 7.
Figure 8B:
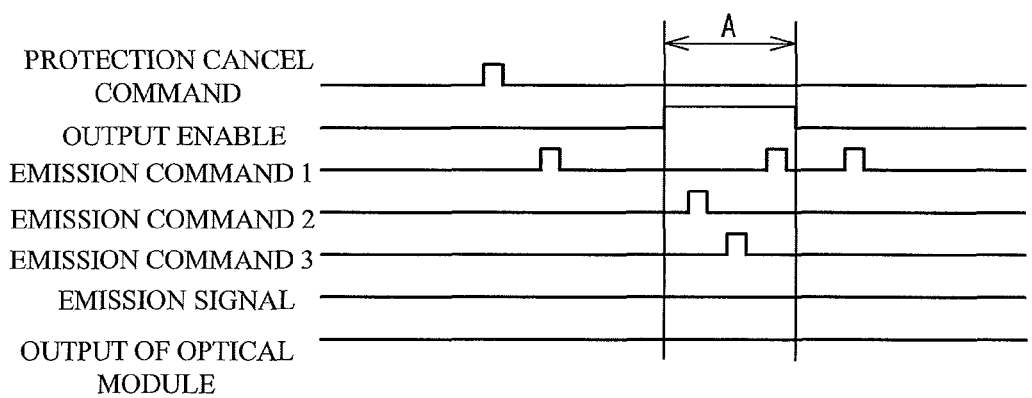

FIG. 8A and FIG. 8B illustrate a time chart of the operation of the flowchart of FIG. 7. As illustrated in FIG. 8A, the control device 20 activates an output enable only for a predetermined period (a period A) after a predetermined time passes after a protection cancel command is input. An emission command for a period when the output enable is not activated is canceled. When the order of the emission command input in the period A is correct, the control device 20 inputs an emission signal into the light source 12. When the emission signal is output from the control device 20, the optical module 10 starts to output an optical signal.

On the other hand, as illustrated in FIG. 8B, the order of the emission command input in a period when the output enable is activated is not correct, the control device 20 cancels the emission signal. Thus, an erroneous light emission is prevented. With the structure, a safety countermeasure during a canceling of the light emission can be improved. In the flowchart of FIG. 7, the predetermined condition is that a plurality of different emission commands are input in a predetermined order. However, the predetermined condition may be that a plurality of different emission commands are input regardless of the order. In the flowchart of FIG. 7, the emission of the optical module 10 may be stopped when a predetermined condition of the emission is confirmed at a predetermined interval and the predetermined condition is not satisfied, as well as the flowchart of FIG. 6.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An optical amplification device comprising:
    a controller that inputs an emission signal into an optical module when an emission command is input into the controller; and
    an optical module that outputs an amplified light when the emission signal is input into the optical module from the controller,
    wherein the controller cancels the emission signal by not outputting the emission signal into the optical module until a predetermined time passes even if the emission command is input into the controller, when a protection for forbidding a light emission of the optical module is canceled.

2. The optical amplification device as claimed in claim 1, wherein the controller cancels the emission signal in a period other than a predetermined period after the predetermined time passes after the protection is canceled.

3. The optical amplification device as claimed in claim 1, wherein the controller makes the optical module emit a light when a plurality of different emission commands are input into the controller.

4. The optical amplification device as claimed in claim 3, wherein the controller makes the optical module emit a light when a plurality of different emission commands are input into the controller in a predetermined order.

5. The optical amplification device as claimed in claim 1, wherein the controller stops a light emission of the optical module when an emission command is not input in a predetermined period, in a case where the protection is canceled and the optical module emit a light.

6. A method of controlling an optical module that outputs an amplified light when an emission signal is input into the optical module from a controller that inputs the emission signal into the optical module when an emission command is input into the controller, the method comprising:
    canceling the emission signal by not outputting the emission signal into the optical module until a predetermined time passes even if the emission command is input into the controller, when a protection for forbidding a light emission of an optical module is canceled.

7. The method as claimed in claim 6 further comprising canceling the emission signal in a period other than a predetermined period after the predetermined time passes after the protection is canceled.

8. The method as claimed in claim 6 further comprising making the optical module emit a light when a plurality of different emission commands are input into the controller.

9. The method as claimed in claim 6 further comprising making the optical module emit a light when a plurality of different emission commands are input into the controller in a predetermined order.

10. The method as claimed in claim 6 further comprising stopping a light emission of the optical module when an emission command is not input in a predetermined period, in a case where the protection is canceled and the optical module emit a light.

* * * * *